(12) United States Patent
McKnight et al.

(10) Patent No.: US 7,252,514 B2
(45) Date of Patent: Aug. 7, 2007

(54) HIGH DENSITY SPACE TRANSFORMER AND METHOD OF FABRICATING SAME

(75) Inventors: Samuel R. McKnight, New Paltz, NY (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/931,428

(22) Filed: Sep. 2, 2004

(65) Prior Publication Data

US 2006/0046529 A1 Mar. 2, 2006

(51) Int. Cl.
*H01R 12/00* (2006.01)
*H05K 1/00* (2006.01)

(52) U.S. Cl. .................................................. 439/66
(58) Field of Classification Search .................. 439/66, 439/63

See application file for complete search history.

(56) References Cited

U.S. PATENT DOCUMENTS

| | | | |
|---|---|---|---|
| 3,911,361 A * | 10/1975 | Bove et al. ................. 324/761 |
| 4,027,935 A | 6/1977 | Byrnes et al. ............... 439/289 |
| 5,162,257 A | 11/1992 | Yung ........................... 437/183 |
| 5,207,585 A | 5/1993 | Byrnes et al. ................ 439/66 |
| 6,250,933 B1 * | 6/2001 | Khoury et al. ................ 439/66 |
| 6,258,703 B1 | 7/2001 | Cotte et al. .................. 438/612 |
| 6,762,612 B2 * | 7/2004 | Yu et al. ...................... 324/757 |
| 6,965,244 B2 * | 11/2005 | Miller ......................... 324/754 |

OTHER PUBLICATIONS

Cobra® Vertical Technology Probe Card, Wentworth Laboratories, www.wentworth.com (2 pages), no date.

* cited by examiner

*Primary Examiner*—Javaid H. Nasri
(74) *Attorney, Agent, or Firm*—Daniel P. Morris; David Aker

(57) ABSTRACT

A method for forming a space transformer (and a space transformer formed by the method) having a first plate and a second plate, the plates being separated by a frame, and electrical connectors for providing electrical connections between electrical contacts which are relatively closely spaced on the first plate and relatively more widely spaced on the second plate. The method comprises attaching first ends of wires to first electrically conductive regions on the first plate; forming insulating layers over the wires; forming electrically conductive coverings over the insulating layers; and connecting second ends of the wires to second electrically conductive regions on the second plate.

31 Claims, 3 Drawing Sheets

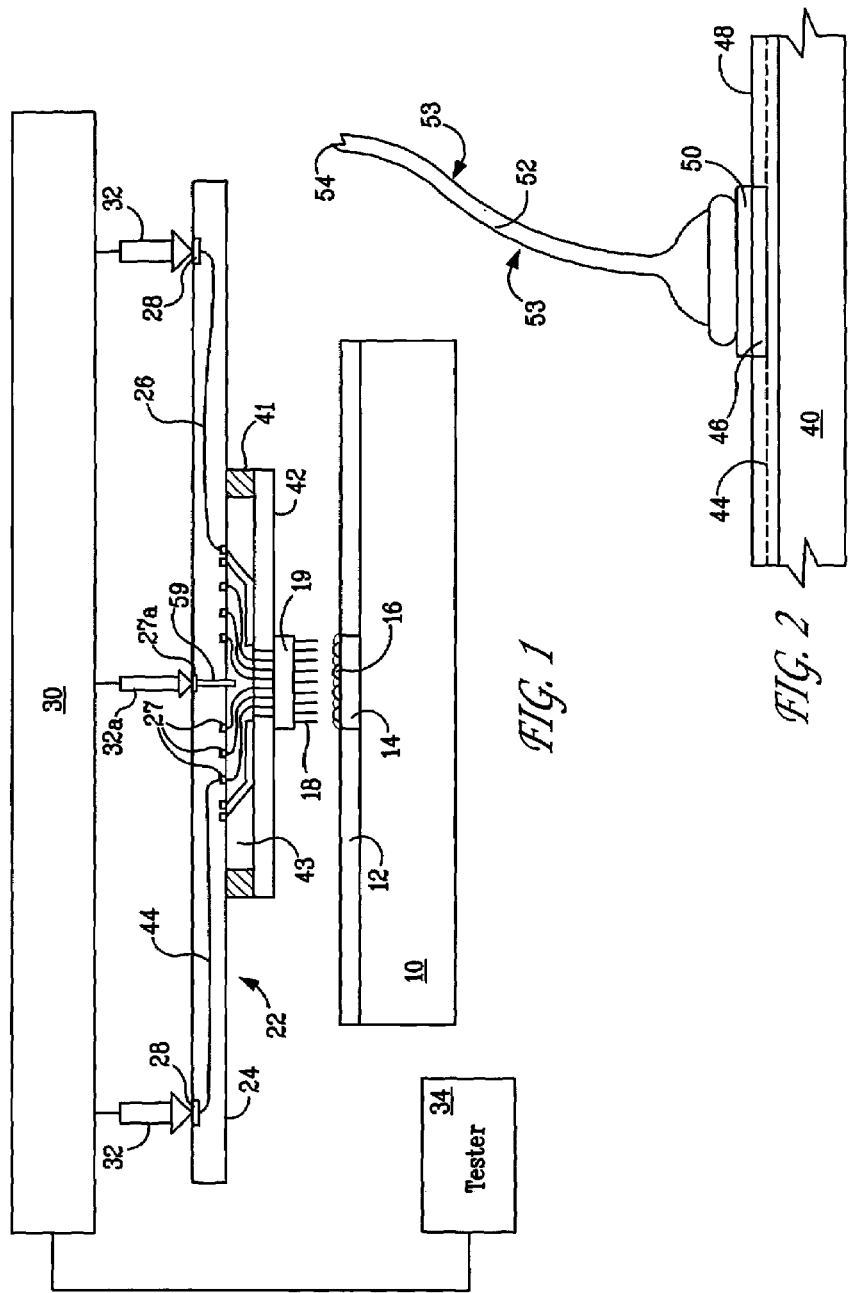

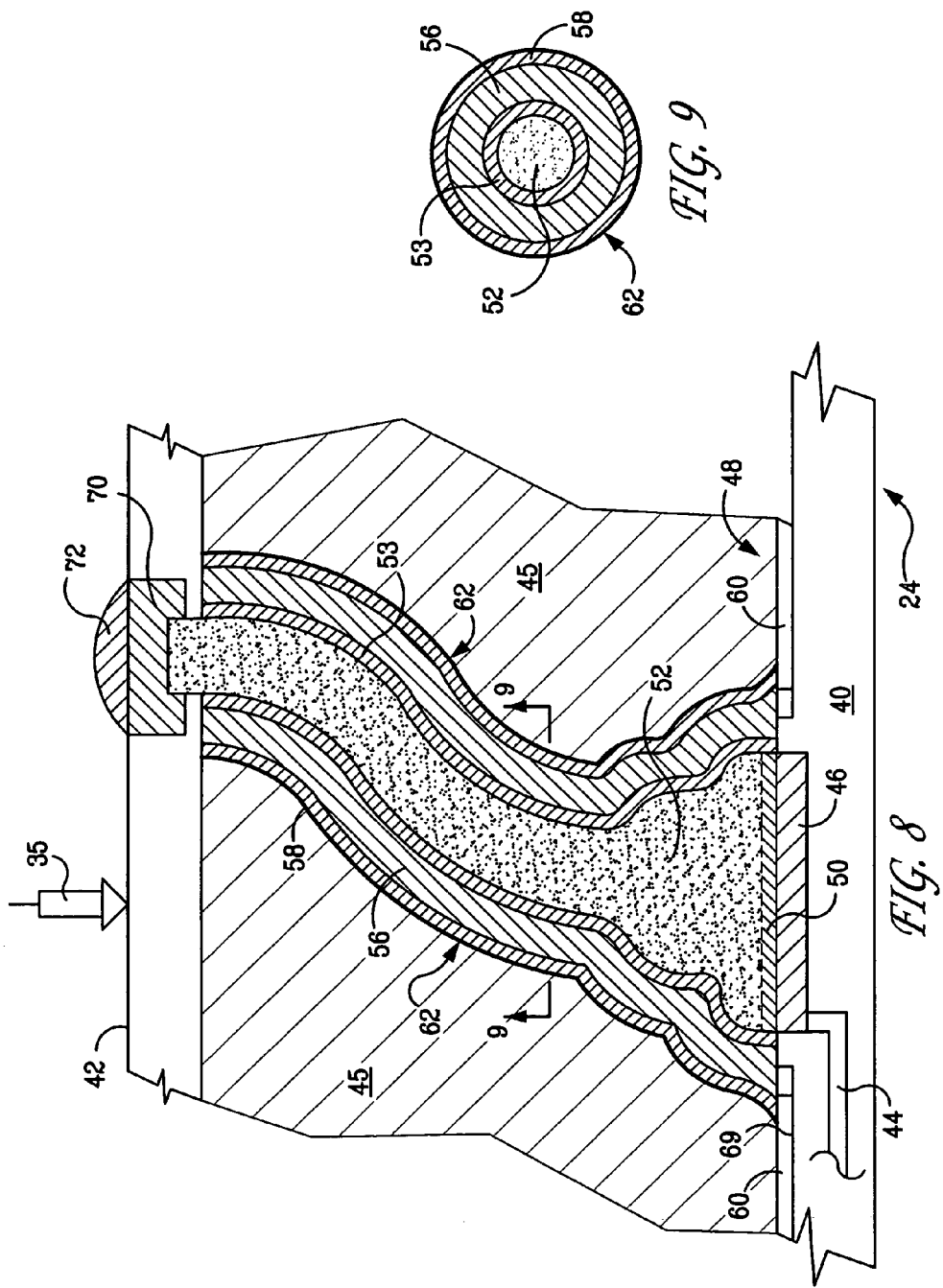

HIGH DENSITY SPACE TRANSFORMER AND METHOD OF FABRICATING SAME

FIELD OF THE INVENTION

This invention relates to electrical interconnection devices and to a method of manufacturing such devices. More particularly, it relates to a fan out apparatus useful for providing reliable connections between, for example, a printed circuit board and a chip under test, and to a method for fabrication of such an apparatus.

BACKGROUND OF THE INVENTION

During the testing of semiconductor wafers, it is often necessary to temporarily connect to semiconductor chip or chips, each containing a complex electronic circuit. This temporary contacting technology is described in detail in for example, U.S. Pat. Nos. 4,027,935 and 5,207,585 assigned to the same assignee as the present invention. These chips have small contact areas which are often connected to chip carriers having electrical conductors for carrying electrical signals between the chips. Contact is often made between these contact areas and the electrical conductors by using the so called C4 solder bump "flip-chip" technology.

Before an investment is made in joining the chips to the chip carrier, it is desirable to test the electrical functionality of each chip. Chips that do not meet test specifications can be discarded, rather than an entire assembly of chips and the chip carrier. In order to do this testing, the very small contact areas on the chip must be connected to a test apparatus. This is typically done at the wafer level.

Typically the contact areas on the chips are impacted by small contact areas of a probing device during test. The difficulty is that the closely spaced pins of the probe must be attached to the more widely spaced lands on a printed circuit board, in order to conduct electrical signals between the test apparatus and the chip having the contact areas that have been contacted by the pins of the probe. This is essentially a fan-out problem.

At least two approaches have been used in an attempt to solve this problem. One makes use of a multilayered ceramic or laminate substrate for the fan-out to the printed circuit board. The main problem with this technique is the lead time; custom designs require additional costs and time to manufacture. From the viewpoint of high frequency, alternating current performance, this approach is better than a second approach noted below.

A second approach uses a hand wired fan-out apparatus made essentially by fabricating a guide template which is a copy of the chip footprint. The wires are manually routed to the printed circuit board. A principal difficulty with this approach is that AC performance of such a hand wired apparatus is very limited, principally because of the unshielded nature of the wires.

SUMMARY OF THE INVENTION

It is therefore an aspect of the present invention to provide an apparatus that is easily, quickly and inexpensively fabricated, and meets this fan-out requirement.

It is another object of the invention to provide an apparatus of the kind mentioned above which has excellent high frequency, alternating current performance.

The invention is directed to a space transformer for providing an electrical connection between a first plurality of relatively closely spaced electrical conductors to a second plurality of relatively more widely spaced electrical conductors. The space transformer comprises a lower plate to which a plurality of connectors is connected so as to be electrically connected to the first plurality electrical conductors and an upper plate to which the plurality of connectors is connected so as to be electrically connected to the second plurality electrical conductors. The electrical conductors are coaxial in nature, so as to have an internal electrical conductor, an insulator about the internal electrical conductor, and an external electrical conductor surrounding the insulator.

As a minimum, the lower plate includes a ground plane, and the outer conductor is connected to the ground plane. The lower plate may be a printed circuit board. The upper plate may be formed of an insulating material, and may be configured with openings therein for accepting internal electrical conductors of the electrical connectors. The openings in the upper plate may extend from a first side of the plate to a second side of the plate. On a side facing the bottom plate, the openings may have a first portion with a dimension sufficiently large to receive an end of the internal electrical conductor, but insufficiently large to receive an end of the internal electrical conductor when the internal electrical conductor is surrounded by the insulator and the external electrical conductor. The openings may have a second portion having a diameter that is larger than that of an end of the internal electrical conductor on a side of the upper plate facing away from the bottom plate. A conductive potting material may be disposed in the second portion. The potting material may be selected from the group consisting of a conductive epoxy, an amalgam and a solder. A layer of a non-reactive conductive material, preferably with an outwardly convex shape may be disposed over the potting material.

The inner conductors may comprise, for example, a metal selected from the group consisting of copper, gold, aluminum, platinum and palladium.

The invention is also directed to a method for forming a space transformer having a first plate and a second plate, the plates being separated by a frame, and electrical connectors for providing electrical connections between electrical contacts which are relatively closely spaced on the first plate and relatively more widely spaced on the second plate. The method comprises attaching first ends of wires to first electrically conductive regions on the first plate; forming insulating layers over the wires; forming electrically conductive coverings over the insulating layers; and connecting second ends of the wires to second electrically conductive regions on the second plate.

The electrically conductive coverings are connected to a ground plane associated with at least one of the first plate and the second plate, and may be electrically connected to one another.

The wires are preferably coated with an oxidation inhibiting coating prior to connecting the wires to the first conductive regions. The oxidation inhibiting coating may be, for example, benzatriazole.

The insulating layers may be formed by vapor deposition. The electrically conductive coverings may also be formed by vapor deposition.

The electrically conductive coverings may be formed by depositing a first electrically conductive material, and a second non-reactive electrically conductive material over the first electrically conductive material. The first electrically conductive material may comprise copper, and the second electrically conductive material comprises gold.

Preferably, wire bonding may be used to attach first ends of wires to first electrically conductive regions on the first plate.

The connecting of second ends of the wires to second electrically conductive regions on the second plate may be performed by placing ends of the wires without respective insulating layers and electrically conductive coverings thereon into openings in the second plate; and potting the wires in place with an electrically conductive potting material.

Preferably, the inner conductor comprises, for example, a metal selected from the group consisting of copper, gold, aluminum, platinum and palladium.

BRIEF DESCRIPTION OF THE DRAWINGS

These and other aspects, features, and advantages of the present invention will become apparent upon further consideration of the following detailed description of the invention when read in conjunction with the drawing figures (in which for clarity, the figures, and especially the thickness of various thin layers therein, are not necessarily to scale), in which:

FIG. 1 is a cross-sectional view of an apparatus in accordance with the invention in use in the testing of a semiconductor chip on a semiconductor wafer;

FIG. 2 is a cross-sectional view of a first steps in the manufacture of an apparatus in accordance with the invention;

FIG. 8 is a greatly enlarged cross-sectional view of a portion of the apparatus of FIG. 1; and FIG. 9 is a cross section taken along line 9-9 of FIG. 8.

DESCRIPTION OF THE INVENTION

Figure 3:
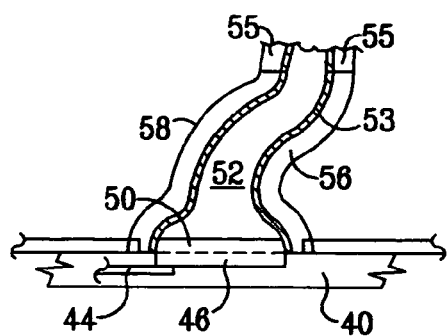
FIG. 3 is a cross-sectional view of a second steps in the manufacture of an apparatus in accordance with the invention.

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

Referring to FIG. 1, a wafer chuck 10, of a type well know in the art, such as for example a vacuum wafer chuck, has mounted on it a semiconductor wafer 12 which has been processed, as is well known in the art to produce thereon a multitude generally identical of semiconductor devices or chips 14, separated by dicing borders (not shown). Wafer 12 is diced at the dicing boarders to produce individual chips.

Each chip 14 has a plurality of contact regions 16 which are eventually used to make electrical connections to the chip 14 for the purpose of bring electrical signal and electrical power to the chip, and for conducting electrical signals from the chip 14. The contact regions 16 may be flip-chip C4 balls, as shown in FIG. 1, or flat wire bond pads (not shown).

The contact regions 16 on the chip 14, may be used for purposes of connecting the chip to an electrical tester to determine whether the chip meets functional specifications: that is whether it performs in an acceptable manner. Chips that do not meet the required electrical specifications are best discarded early, before assembled to chip carriers along with other expensive chips, thus minimizing waste. Alternatively, if a chip displays less than optimum performance, the performance data may be used for purposes of sorting the chip for use in applications where lower performance criteria are acceptable.

In order to test the chip, it is necessary that the contact regions 16 be contacted by the pins 18, extending from a bottom surface of an appropriate removable and replaceable test probe 19. Test probe 19 may have resilient pins such as a Cobra probe, manufactured by Wentworth Labs, of Brookfield, Conn., USA, and disclosed in U.S. Pat. No. 4,027,935 or more rigid pins, such as a probe manufactured by TFI, Inc. of USA, and disclosed in U.S. Pat. No. 5,207,585.

In accordance with the invention, test probe 19 is supported by a space transformer shown generally as 22, which provides fan-out electrical connections to a printed circuit board 24. Test probe 19 is aligned with space transformer 22 by appropriate alignment pins, and may be secured thereto with a series of screws. Printed circuit board 24 has electrical conductors 44 that are connected between contact regions 27 on the surface of printed circuit board 24 and contact regions 28 on the surface of printed circuit board 24 opposite to that in contact with space transformer 22. Contact regions 28 of printed circuit board 24 may be in turn electrically connected to a test apparatus 30 by means of so called "pogo" type of spring loaded electrical pins 32, of a type well known in the art. Apparatus 30 may contain any number of well known electrical test circuits, which may be under the control of a digital tester 34, preferably operating under computer control, to allow the thorough exercise and testing of the circuits formed on chips 14, as the pins 18 of probe 19 are moved to come into contact with the contact regions 16 of successive chips 14. This is accomplished by providing an appropriate mechanical arrangement (not shown), of a type well known in the art to raise, lower and reposition preferably the chuck 10 (or the probe 19) so that contact regions 16 on successive chips 14 of wafer 12 are contacted by pins 18 of probe 19. In other words, a series of appropriate relative movements of wafer 12 with respect to pins 18 of probe 19 occur so that successive chips 14 are tested. During the test data is accumulated by tester 34, to provide an appropriate output to allow a manual or automatic disposition to be made of each chip 14 after it is separated from wafer 12 by an appropriate dicing operation.

The manner in which space transformer 22 may be constructed will be described with respect to the successive stages of construction illustrated in FIG. 2 through FIG. 7. However, for clarity, reference should also be made to FIG. 8 and FIG. 9.

Referring to FIG. 2 and FIG. 8, a space transformer 22 is fabricated from printed circuit board 24, a part of which is referred to below as printed circuit board 40 and an upper guide plate 42, separated by a frame 41 (FIG. 1), with an opening 43 therein for receiving wires, as more fully described below. Guide plate 42 has pin contact regions 72 (FIG. 8) for being contacted by the upper ends of pins 18 of probe 19. The upper ends of pins 18 can flex slightly upon such contact, in a manner well known in the art. In fact, such flexing makes up for any disparities in the topography of the pin contact regions, thus assuring that all pins make contact with their respective pin contact region. These pin contact regions 72 ultimately are each electrically connected to a respective conductor 44 within printed circuit board 40 by a wire 52.

Each conductor 44 extends to a land 46, preferably formed of copper, which is disposed preferably at and below the surface 48 of circuit board 40. A layer 50 of a non-reactive metal, preferably gold, is formed over land 46. A wire 52, preferably formed of copper (but which may comprise gold, silver, aluminum, platinum, palladium or any metallic conductive material suitable for wire bonding), is bonded, using a commercially available wire bonder of a type well known in the art, to each layer 50 over land 46. This bonding operation is performed in an inert atmosphere, such as a nitrogen gas atmosphere. In all areas except where bonding takes place, the copper wire is prevent from oxidizing by coating it with an oxide inhibitor 53 such as benzatriazole (ETA), or an equivalent compound or coating. The copper wire, after being bonded as described above, is cut, generally by the bonder, to form an end region 54.

Referring to FIG. 3, after copper wires 52 have been bonded as described above, to respective layers 50, most of the length of the wires is coated with a suitable dielectric layer 56 of a material such as a polyimide. Various methods of dielectric deposition or coating may be utilized, as is well known in the art. The thickness of dielectric layer 56 is determined by the desired electrical impedance of the conductors formed by wires 52 and the respective layers that are deposited thereon, as more fully describe below. The unconnected top end regions 54 of wires 52 are masked by an appropriate organic compound 55, of a type well known in the art, which is later removed, as described below, and thus the end regions 54 are not coated with the dielectric layer 56.

Figure 4:
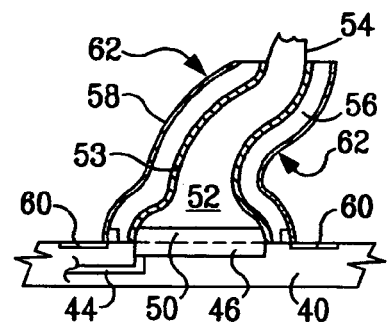
FIG. 4 is a cross-sectional view of a third steps in the manufacture of an apparatus in accordance with the invention.

Referring to FIG. 4, after the dielectric layer 56 has been applied, an outer conductive layer 58 formed of a conductor (preferably copper) is applied over dielectric layer 56 of each wire 52. Conductive layer 58 is applied by a deposition process, or plating, such as, for example, a vapor deposition process, so that lower portions thereof are electrically connected to a ground plane 60 on the upper surface of circuit board 40. A further thin anticorrosion layer 62 (shown generally as a thickened line in, for example, FIG. 8), such as one made up of an non-reactive metal, such as gold, is applied over conductive layer 58 so as to stabilize the conductive layer 58 against corrosion during subsequent processing and use. Thus, each wire 52 is now surrounded by a dielectric layer and conductive layers, thus forming, in effect, a miniature coaxial cable. The impedance for such an arrangement may be determined in a manner well know in the art, and is related to the outer diameter of the inner conductor, the inner diameter of the outer conductor, and the dielectric constant of the material there between. The dimensions and dielectric constant may be selected so that these miniature coaxial cables have an impedance of, for example, fifty ohms. In addition to providing predictable impedance levels, the arrangement of the plurality of conductors provides excellent propagation characteristics for alternating current and pulse signals, that is far superior to that provided by simple wire bonded conductors.

After conductive layer 58 and an appropriate anticorrosion layer have been applied, the mask material applied to the end regions 54 of each wire 52 is removed by a process of a type well known in the art, such as for example, an etching or dissolution process, or chemical process, or laser ablation, thus making it available for electrical connection.

While masking and unmasking of the end regions 54 of wires 52 is preferred, it will be recognized that if such masking is not used, it is possible to expose the end regions of wires 52 for further processing by removing the various layer applied thereto. However, this is not presently regarded as the most efficient and effective approach.

Figure 5:
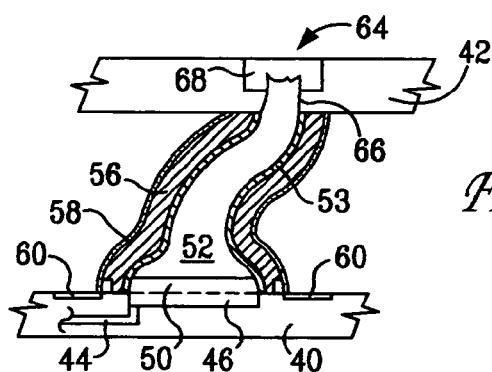
FIG. 5 is a cross-sectional view of a fourth steps in the manufacture of an apparatus in accordance with the invention.

Referring to FIG. 5, an upper guide plate 42, which is formed of an insulating material, such as a ceramic has a series of openings 64. Each opening 64 has a bottom region 66 which is essentially a hole for closely receiving only the end region 54 of a respective wire 52. The remainder of wire 52, with its dielectric and conductive coatings, is of too large a diameter to be received in bottom region 66. Each opening 64 has a top region 68 which is essentially a cylindrical recess into which a portion of end region 54 of respective wire 52 extends. Each end region 58 of a wire 52 is positioned, during the wire bonding process, so that it will extend into a respective opening 64 in upper guide plate 42.

In order to keep wires 52 from moving due to any shock or vibration that space transformer 22 may experience, the opening 43 in which the wires are disposed may be filed with an encapsulation material 45 (not shown, for clarity, in FIG. 1, but shown in FIG. 8), such as a polyurethane, which is allowed to cure so as to support the wires 52 in place. However, it is preferable that a conductive material be used, such as a conductive epoxy, or a metal alloy having low melting temperature (such as an amalgam, or a low temperature solder), to fill the opening 43 so as to tie together the outer conductive layers 58 (or more specifically, the anticorrosion layers 62) 50 that optimum high frequency, alternating current performance is achieved, and so that there is a convenient manner to connect the circuit ground to the next higher level of electrical connection, on the way to the tester apparatus 30. To this end, a conductor 59 (FIG. 1), which extends from a contact region 27a on the top surface of plate 40, through plate 40, and into conductive encapsulation material 45, is contacted by a pin 32a (which may be of the same type as pins 32) that connects to test apparatus 30, thus providing the ground connection.

A ground plane (not shown) having openings positioned so that the ground plane is not present in the vicinity of and does not interfere with the coaxial electrical conductors formed by the wires 52 and their respective surrounding layers, may be disposed on the lower surface of plate 42. This ground plane may be electrically connected to conductor 59, for example, by soldering. If encapsulation material 45 is electrically conductive, an electrical connection between this ground plane and the outer conductive layers 58 (or more specifically, the anticorrosion layers 62) will be facilitated.

If the guide plate 42 is not an insulator, but is formed of an electrically conductive material, then a ground plane and the conductor 59 are not necessary, as electrical contact may be made by a pin 35 directly contacting the top surface of guide plate 42. In this case, provisions must be made for insulating the wires 52 from the guide plate, as for, by way of example, providing an insulating material on the walls of bottom region 66 and top region 68 of openings 64.

Figure 6:
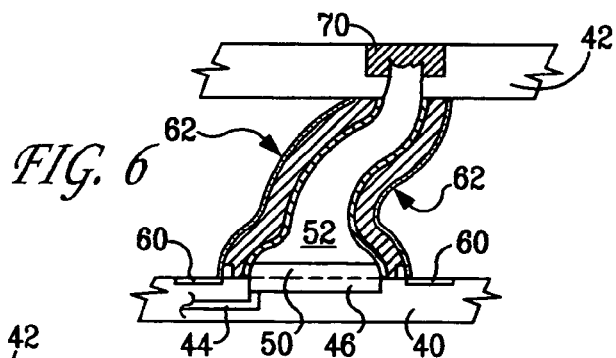
FIG. 6 is a cross-sectional view of a fifth steps in the manufacture of an apparatus in accordance with the invention.

Referring to FIG. 6, each top region 68 is filled with a conductive epoxy to form a body 70, which is allowed to cure, thus securing respective end region 58 of its respective wire 52 permanently in place in upper guide plate 42.

Figure 7:
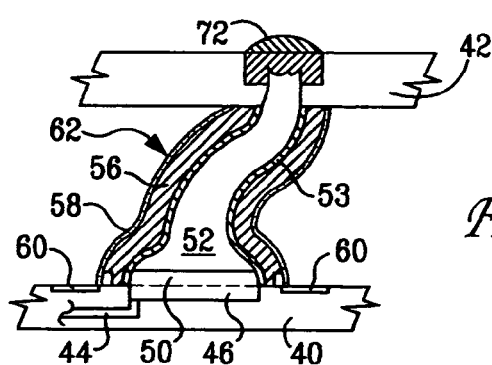
FIG. 7 is a cross-sectional view of a sixth steps in the manufacture of an apparatus in accordance with the invention.

Referring to FIG. 7, a hard gold or equivalent non-corroding and highly conductive plating 72, having a slightly convex shape, is applied, for example by a deposition process, to each cured epoxy body 70, thus providing a reliable electrical contact region for contact with respective upper ends of pins 18 of probe 19, as discussed above.

Thus, a space transformer which may be fabricated for use with very high density contact regions on a semiconductor chip, such as those that can be used to make high density C4 connections, and a method for fabricating such an apparatus have been disclosed. By high density, it is meant that high connection region densities may be achieved; that is a large number of connections may be achieved per unit area to devices under test. The spacing between adjacent connections may be as low as 0.002 to 0.006 inch (0.0508 to 0.152 mm) or smaller. Further, this is accomplished while providing excellent conductivity and impedance matching for signals having high frequency components.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

The invention claimed is:

1. A space transformer for providing an electrical connection between a first plurality of relatively closely spaced electrical conductors to a second plurality of relatively more widely spaced electrical conductors, comprising:
   a lower plate;
   a plurality of electrical connectors connected to said lower plate so as to be electrically connected to said first plurality electrical conductors;
   an upper plate to which said plurality of connectors is connected so as to be electrically connected to said second plurality electrical conductors; and
   a frame between said lower plate and said upper plate, said frame, said lower plate and said upper plate defining a closed space;
   said electrical connectors being coaxial, so as to have an internal electrical conductor, an insulator about said internal electrical conductor, and an external electrical conductor surrounding said insulator; and
   an electrically conductive potting material in said closed space and surrounding said external electrical conductors.

2. The space transformer of claim 1, wherein at least said lower plate includes a ground plane, and said outer conductor is connected to said ground plane.

3. The space transformer of claim 1, wherein said lower plate is a printed circuit board.

4. The space transformer of claim 1, wherein said upper plate is formed of an insulating material, and is configured with openings therein for accepting internal electrical conductors of said electrical connectors.

5. The space transformer of claim 4, wherein said openings in said upper plate extend from a first side of said plate to a second side of said plate, and on a side facing said bottom plate, said openings have a first portion with a dimension sufficiently large to receive an end of said internal electrical conductor, but insufficiently large to receive an end of said internal electrical conductor when said internal electrical conductor is surrounded by said insulator and said external electrical conductor.

6. The space transformer of claim 5, wherein said openings have a second portion having a diameter that is larger than that of an end of said internal electrical conductor on a side of said upper plate facing away from said bottom plate.

7. The space transformer of claim 6, further comprising a conductive potting material disposed in said second portion.

8. The space transformer of claim 7, wherein said potting material is selected from the group consisting of a conductive epoxy, an amalgam and a solder.

9. The space transformer of claim 7, further comprising a layer of a nonreactive conductive material over said potting material.

10. The space transformer of claim 7, wherein said nonreactive conductive material has an outwardly convex shape.

11. The space transformer of claim 1, wherein said inner conductors comprises a metal selected from the group consisting of copper, gold, aluminum, platinum and palladium.

12. The space transformer of claim 1, wherein said upper plate comprises a ground plane.

13. The space transformer of claim 1, wherein said potting material is electrically conductive.

14. The space transformer of claim 13, further comprising an electrical conductor extending through said upper plate and into said potting material.

15. The space transformer of claim 14, further comprising a contact region on a surface of said plate for making an electrical connection to said electrical conductor extending through said upper plate.

16. The space transformer of claim 1, in combination with an electrical tester for testing a circuit, the electrical tester being electrically connected to said space transformer.

17. The combination of claim 16, wherein said electrical tester comprises a computer for controlling operation of said electrical tester.

18. A method for forming a space transformer having a first plate and a second plate, said plates being separated by a frame, and electrical connectors for providing electrical connections between electrical contacts which are relatively closely spaced on said first plate and relatively more widely spaced on said second plate, said method comprising:
   attaching first ends of wires to first electrically conductive regions on said first plate;
   forming insulating layers over said wires by using a deposition process;
   forming electrically conductive coverings over said insulating layers by using a deposition process; and
   connecting second ends of said wires to second electrically conductive regions on said second plate;
   said insulating layers and said electrically conductive coverings being formed so as to extend from said first plate to said second plate.

19. The method of claim 18, further comprising connecting said electrically conductive coverings to a ground plane associated with at least one of said first plate and said second plate.

20. The method of claim 19, wherein said electrically conductive coverings are connected to a ground plane on only one of said first plate and said second plate.

21. The method of claim 18, further comprising coating said wires with an oxidation inhibiting coating prior to connecting said wires to said first conductive regions.

22. The method of claim 21, wherein said oxidation inhibiting coating comprises benzatriazole.

23. The method of claim 18, wherein said insulating layers are formed by vapor deposition.

24. The method of claim 18, wherein said electrically conductive coverings are formed by vapor deposition.

25. The method of claim 18, wherein said electrically conductive coverings are formed by depositing a first electrically conductive material, and a second non-reactive electrically conductive material over said first electrically conductive material.

26. The method of claim 25, wherein said first electrically conductive material comprises copper, and said second electrically conductive material comprises gold.

27. The method of claim 18, wherein said attaching first ends of wires to first electrically conductive regions on said first plate is performed by wire bonding.

28. The method of claim 18, wherein said connecting second ends of said wires to second electrically conductive regions on said second plate is performed by placing ends of said wires without respective insulating layers and electrically conductive coverings thereon into openings in said second plate; and potting said wires in place with an electrically conductive potting material.

29. The method of claim 18, wherein said inner conductor comprises a metal selected from the group consisting of copper, gold, aluminum, platinum and palladium.

30. The method of claim 18, wherein said space transformer is formed so that spacing between adjacent electrical contacts on said first plate is between 0.002 and 0.006 inch.

31. The method of claim 18, said frame, said lower plate and said upper plate define a closed space; and providing an electrically conductive potting material in said closed space, said potting material surrounding said external electrical conductors.

* * * * *